(12) United States Patent
Sakuma et al.

(10) Patent No.: US 7,253,446 B2
(45) Date of Patent: Aug. 7, 2007

(54) LIGHT EMITTING DEVICE AND ILLUMINATION APPARATUS

(75) Inventors: Ken Sakuma, Sakura (JP); Naoki Kimura, Sakura (JP); Koichiro Masuko, Sakura (JP); Naoto Hirosaki, Tsukuba (JP)

(73) Assignees: Fujikura Ltd., Tokyo (JP); Independent Administrative Institution National Institute for Materials Science, Ibaraki-ken (JP)

( * ) Notice: Subject to any disclaimer, the term of this patent is extended or adjusted under 35 U.S.C. 154(b) by 0 days.

(21) Appl. No.: 11/344,126

(22) Filed: Feb. 1, 2006

(65) Prior Publication Data

US 2006/0208262 A1    Sep. 21, 2006

(30) Foreign Application Priority Data

Mar. 18, 2005    (JP)    ............................ P2005-079059

(51) Int. Cl.
| | |
|---|---|
| H01L 21/22 | (2006.01) |
| H01L 31/0256 | (2006.01) |
| H01L 31/0296 | (2006.01) |
| H01L 33/00 | (2006.01) |

(52) U.S. Cl. .......................................... 257/98; 257/78
(58) Field of Classification Search ........... 257/78–103
See application file for complete search history.

(56) References Cited

U.S. PATENT DOCUMENTS

| | | |
|---|---|---|
| 2003/0006702 A1 | 1/2003 | Mueller-Mach et al. |
| 2003/0030038 A1 | 2/2003 | Mitomo et al. |
| 2005/0194604 A1* | 9/2005 | Sakuma et al. ............... 257/98 |
| 2006/0284196 A1* | 12/2006 | Setlur et al. .................. 257/98 |

FOREIGN PATENT DOCUMENTS

| | | |
|---|---|---|
| JP | 10-163535 A | 6/1998 |
| JP | 2900928 B2 | 3/1999 |
| JP | 2927279 B2 | 5/1999 |

(Continued)

OTHER PUBLICATIONS

Kanji Bando, et al. "Development of High-Bright and Pure-White LED Lamps," J. Light & Vis. Env., vol. 22, No. 1, 1998.

(Continued)

*Primary Examiner*—Cuong Nguyen
(74) *Attorney, Agent, or Firm*—Sughrue Mion, PLLC

(57) ABSTRACT

A light-emitting device and illumination apparatus using the same are provided. The light-emitting device includes a semiconductor light-emitting element that emits blue-violet or blue light and a fluorescent material that absorbs the light emitted by the semiconductor light-emitting element and emits fluorescence of wavelengths different from the light, wherein the fluorescent material includes a mixture of a first fluorescent material, a second fluorescent material that has a longer emission wavelength than that of the first fluorescent material, and a third fluorescent material that has a longer emission wavelength than the second fluorescent material, and the first fluorescent material is a europium-activated β-SiAlON fluorescent material, the second fluorescent material is a europium-activated α-SiAlON fluorescent material, and the third fluorescent material is a nitride crystalline red fluorescent material of a general formula of $(Ca,Eu)AlSiN_3$. The illumination apparatus includes a light source including a light emitting device as described above.

26 Claims, 8 Drawing Sheets

FOREIGN PATENT DOCUMENTS

| | | |
|---|---|---|
| JP | 2002-363554 A | 12/2002 |
| JP | 2003-273409 A | 9/2003 |
| JP | 2003-321675 A | 11/2003 |
| WO | WO 2005/033247 A1 | 4/2005 |

OTHER PUBLICATIONS

Motokazu Yamada, et al. "Red-Enhanced White-Light-Emitting Diode Using a New Red Phosphor," Jpn. J. Appl. Phys., vol. 42, 2003.

Paul S. Martin, "Performance, Thermal, Cost & Reliability Challenges for Solid State Lighting," OIDA Conference, May 30, 2002.

Rong-Jun Xie, et al. "$Eu^{2+}$-Doped Ca-α-SiAlON: A Yellow Phosphor for White Light-Emitting Diodes," Applied Physics Letters, vol. 84. No. 26, Jun. 28, 2004.

Ken Sakuma, et al. "Warm-White Light-Emitting Diode With Yellowish Orange SiAlON Ceramic Phosphor," Optics Letters, vol. 29, No. 17, Sep. 1, 2004.

* cited by examiner

LIGHT EMITTING DEVICE AND ILLUMINATION APPARATUS

BACKGROUND OF THE INVENTION

1. Field of the Invention

The present invention relates to a light-emitting device used in the field of lighting and an illumination apparatus using the same.

This application claims priority from Japanese Patent Application No. 2005-079059, filed Mar. 18, 2005 in the Japanese Patent Office, the entire content of which is incorporated herein by reference.

2. Description of the Related Art

In the field of lighting, there is great expectation for solid state lighting, particularly in regard to white lighting using semiconductor light-emitting diodes, which are the target of extensive and aggressive research and development efforts. White light-emitting diode lamps have achieved light-emitting efficiency equal to or higher than incandescent lamps, and have the potential of further improvement. It is anticipated that they will come to be used extensively as energy-saving illumination apparatuses in the near future. It is advantageous that white light-emitting diode lamps do not contain substances that impose an environmental load, such as mercury. Because of their small size, white light-emitting diode lamps are incorporated in backlights of liquid crystal display devices and mobile phones and are widely used.

The present invention relates to a light-emitting device used in the field of lighting and provides a light-emitting device having high efficiency, excellent long-term reliability, and various emission colors, such as, for example, daylight, neutral white, white, warm white, and incandescent lamp colors, for improved color rendering, and an illumination apparatus using the same.

In the prior art, white light-emitting diode lamps (hereafter referred to as LEDs) are known which use an LED element that emits light of short wavelengths such as blue light and a fluorescent (phosphor) material that absorbs and is excited by all or a part of the light emitted by the LED element and emits fluorescence of longer wavelengths such as yellow fluorescence. For example, a white LED lamp including a compound semiconductor blue LED element and a cerium-activated yttrium-aluminum-garnet (hereafter referred to as YAG) fluorescent material that absorbs blue light and emits yellow, a complementary color to blue, fluorescence is described in Japanese Patent Publication Nos. 2900928 and 2927279 and in K. Bando, K. Sakano, Y. Noguchi, and Y. Shimizu, "Development of High-bright and Pure-white LED Lamps," J. Light & Vis. Env.; Vol. 22, No. 1 (1998), pp. 2-5.

Adding a red light-emitting material to compensate for the red constituent is a known technique. Japanese Unexamined Patent Application, First Publication No. 2003-273409 discloses a technique in which a red fluorescent material such as $(Sr_{1-x-y-z}Ba_xCa_y)_2Si_5N_8:Eu_z^{2+}$ or SrS:Eu, $(Ca_xSr_{1-x})$S:Eu$^{2+}$ is added to a white LED including a blue LED element and a cerium-activated YAG fluorescent material. Similar techniques are disclosed in Japanese Unexamined Patent Application, First Publication No. 2003-321675 and in M. Yamada, T. Naitou, K. Izuno, H. Tamaki, Y. Murazaki, M. Kameshima, and T. Mukai, "Red-Enhanced White-Light-Emitting Diode Using a New Red Phosphor," Jpn. J. Appl. Phys. Vol. 42, (2003) pp. L20-L23.

Further, a technique to realize a white LED using a blue LED element, a fluorescent material excited by blue light and emitting green light, and a fluorescent material excited by blue light and emitting red light is known and disclosed, for example, in Japanese Unexamined Patent Application, First Publication No. H10-163535. Further, a white LED using $SrGa_2S_4:Eu^{2+}$, a fluorescent material excited by blue light and emitting green light, and $SrS:Eu^{2+}$, a fluorescent material excited by blue light and emitting red light, is disclosed, for example, in Paul S. Martin, "Performance, Thermal, Cost & Reliability challenges for Solid State Lightning," OIDA Conference, May 30th, 2002.

Recently, there has been extensive research on oxynitride and nitride fluorescent materials. For example, europium (Eu)-activated calcium (Ca) doped α-SiAlON fluorescent material is known from Japanese Unexamined Patent Application, First Publication No. 2002-363554. This fluorescent material is excited by blue light and emits yellow light and, therefore, may be advantageously used as a white LED wavelength conversion material. This fluorescent material is described in detail, for example, by R. J. Xie, N. Hirosaki, K. Sakuma, Y. Tamamoto, M. Mitomo, "Eu$^{2+}$-doped Ca-α SiAlON: A yellow phosphor for white light-emitting diodes," Appl. Phys. Lett., Vol. 84, pp. 5404-5406 (2004). A low color temperature white LED lamp using the fluorescent material and having excellent color stability in the presence of temperature changes is described by K. Sakuma, K. Omichi, N. Kimura, M. Ohashi, D. Tanaka, N. Hirosaki, Y. Yamamoto, R.-J. Xie, T. Suehiro, "Warm-white light-emitting diode with yellowish orange SiAlON ceramic phosphor," Opt. Lett. Vol. 29, pp. 2001-2003 (2004).

Conventionally, fluorescent materials are predominantly oxides or sulfides and must be further improved in terms of durability and their high-temperature properties. Recent efforts have been focused on developing oxynitride and nitride fluorescent materials having improved long-term reliability and high-temperature properties.

Extensive research is taking place regarding solid state lighting devices using a combination of a semiconductor light-emitting element and a fluorescent material, where oxide or sulfide fluorescent materials are the primary materials.

The development of a light-emitting device using an oxynitride or nitride fluorescent material and having high emission efficiency and excellent long-term reliability and high-temperature properties is needed.

SUMMARY OF THE INVENTION

It is an object of the present invention to provide a light-emitting device having high emission efficiency, excellent long-term reliability and high-temperature properties, improved color rendering, and an illumination apparatus using the same.

In order to achieve the above and other objects, a light-emitting device is provided according to an exemplary embodiment of the present invention. The device includes a semiconductor light-emitting element that emits blue-violet or blue light; and a fluorescent material that absorbs part or all of the blue-violet or blue light emitted by the semiconductor light-emitting element and emits fluorescence of wavelengths different from that of the blue-violet or blue light, the fluorescent material comprising a mixture of a first fluorescent material that emits green or yellow-green light, a second fluorescent material that has a longer emission wavelength than that of the first fluorescent material and emits yellow-green, yellow, or yellow-red light, and a third fluorescent material that has a longer emission wavelength than the second fluorescent material and emits yellow-red or red light. The first fluorescent material is a europium-activated β-SiAlON fluorescent material, the second fluorescent material is a europium-activated α-SiAlON fluorescent material, and the third fluorescent material is a nitride crystalline red fluorescent material expressed by a general formula of $(Ca,Eu)AlSiN_3$.

According to another exemplary embodiment of the present invention, a light-emitting device is provided and includes a semiconductor light-emitting element that emits blue-violet or blue light; and a fluorescent material that absorbs part or all of the blue-violet or blue light emitted by the semiconductor light-emitting element and emits fluorescence of wavelengths different from that of the blue-violet or blue light, the fluorescent material comprising a mixture of a first fluorescent material that emits green or yellow-green light, a second fluorescent material that has a longer emission wavelength than that of the first fluorescent material and emits yellow-green, yellow, or yellow-red light, and a third fluorescent material that has a longer emission wavelength than the second fluorescent material and emits yellow-red or red light. The first fluorescent material is a europium-activated β-SiAlON fluorescent material, the second fluorescent material is a europium-activated α-SiAlON fluorescent material, and the third fluorescent material is a nitride crystalline red fluorescent material expressed by the general formula of $(Ca,Eu)AlSiN_3$, and the α-SiAlON fluorescent material is expressed by the general formula of $Ca_q Eu_r(Si,Al)_{12}(O,N)_{16}$ in which q is between about 0.75 and about 1.0 and r is between about 0.03 and about 0.07 and has a primary phase of an α-SiAlON crystalline structure.

According to yet another exemplary embodiment of the present invention, a light-emitting device is provided and includes a semiconductor light-emitting element that emits blue-violet or blue light; and a fluorescent material that absorbs all or part of the blue-violet or blue light emitted by the semiconductor light-emitting element and emits fluorescence of wavelengths different from that of the blue-violet or blue light, the fluorescent material comprising a mixture of a first fluorescent material that emits green or yellow-green light, a second fluorescent material that has a longer emission wavelength than that of the first fluorescent material and emits yellow-green, yellow, or yellow-red light, and a third fluorescent material that has a longer emission wavelength than the second fluorescent material and emits yellow-red or red light. The first fluorescent material is a europium-activated β-SiAlON fluorescent material, the second fluorescent material is a europium-activated α-SiAlON fluorescent material, and the third fluorescent material is a nitride crystalline red fluorescent material expressed by the general formula of $(Ca,Eu)AlSiN_3$, and the β-SiAlON fluorescent material is expressed by the general formula $Eu_s(Si,Al)_{6-s}(O,N)_8$ in which s is between about 0.011 and about 0.019 and has a primary phase of a β-SiAlON crystalline structure.

Light obtained by mixing the light emitted by the semiconductor light-emitting element and the fluorescence emitted by the fluorescent material may have chromaticity within the daylight color range expressed by a rectangle formed on a CIE 1931 XYZ calorimetric system chromaticity diagram by connecting a first point at the coordinates of x=0.3274 and y=0.3673, a second point at the coordinates of x=0.3282 and y=0.3297, a third point at the coordinates of x=0.2998 and y=0.3396, and a fourth point at the coordinates of x=0.3064 and y=0.3091.

The fluorescent material may comprise a mixture of the first, second, and third fluorescent materials with a mass ratio of (7.5×C/A):(1.3×C/B):1 provided that peak emission intensities of the first, second, and third fluorescent materials are A:B:C, respectively, when measured by a spectrum corrected fluorescence spectrophotometer.

The fluorescent material may comprise a mixture of the first, second, and third fluorescent materials with a mass ratio of 12:2:1.

Light resulting from the mixture of light emitted by the semiconductor light-emitting element and the fluorescence emitted by the fluorescent material may have chromaticity within the neutral white color range expressed by a rectangle formed on a CIE 1931 XYZ colorimetric system chromaticity diagram by connecting a first point at the coordinates of x=0.3616 and y=0.3875, a second point at the coordinates of x=0.3552 and y=0.3476, a third point at the coordinates of x=0.3353 and y=0.3659, and a fourth point at the coordinates of x=0.3345 and y=0.3314.

The fluorescent material may comprise a mixture of the first, second, and third fluorescent materials with a mass ratio of (6.5×C/A):(1.3×C/B):1 provided that peak emission intensities of the first, second, and third fluorescent materials are A:B:C, respectively, when measured by a spectrum corrected fluorescence spectrophotometer.

The fluorescent material may comprise a mixture of the first, second, and third fluorescent materials with a mass ratio of 10.3:2:1.

Light obtained by mixing the light emitted by the semiconductor light-emitting element and the fluorescence emitted by the fluorescent material may have chromaticity within the white color range expressed by a rectangle formed on a CIE 1931 XYZ colorimetric system chromaticity diagram by connecting a first point at the coordinates of x=0.3938 and y=0.4097, a second point at the coordinates of x=0.3805 and y=0.3642, a third point at the coordinates of x=0.3656 and y=0.3905, and a fourth point at the coordinates of x=0.3584 and y=0.3499.

The fluorescent material may comprise a mixture of the first, second, and third fluorescent materials with a mass ratio of (6.3×C/A):(1.9×C/B):1 provided that peak emission intensities of the first, second, and third fluorescent materials are A:B:C, respectively, when measured by a spectrum corrected fluorescence spectrophotometer.

The fluorescent material may comprise a mixture of the first, second, and third fluorescent materials with a mass ratio of 10:3:1.

Light obtained by mixing the light emitted by the semiconductor light-emitting element and the fluorescence emitted by the fluorescent material may have chromaticity within the warm white color range expressed by a rectangle formed on a CIE 1931 XYZ calorimetric system chromaticity diagram by connecting a first point at the coordinates of x=0.4341 and y=0.4233, a second point at the coordinates of x=0.4171 and y=0.3846, a third point at the coordinates of x=0.4021 and y=0.4076, and a fourth point at the coordinates of x=0.3903 and y=0.3719.

The fluorescent material may comprise a mixture of the first, second, and third fluorescent materials with a mass ratio of (5.1×C/A):(1.9×C/B):1 provided that peak emission intensities of the first, second, and third fluorescent materials are A:B:C, respectively, when measured by a spectrum corrected fluorescence spectrophotometer.

The fluorescent material may comprise a mixture of the first, second, and third fluorescent materials with a mass ratio of 8:3:1.

Light obtained by mixing the light emitted by the semiconductor light-emitting element and the fluorescence emitted by the fluorescent material may have chromaticity within the incandescent lamp color range expressed by a rectangle formed on a CIE 1931 XYZ colorimetric system chromaticity diagram by connecting a first point at the coordinates of x=0.4775 and y=0.4283, a second point at the coordinates of x=0.4594 and y=0.3971, a third point at the coordinates of x=0.4348 and y=0.4185, and a fourth point at the coordinates of x=0.4214 and y=0.3887.

The fluorescent material may comprise a mixture of the first, second, and third fluorescent materials with a mass ratio of (5.1×C/A):(1.6×C/B):1 provided that peak emission intensities of the first, second, and third fluorescent materials are A:B:C, respectively, when measured by a spectrum corrected fluorescence spectrophotometer.

The fluorescent material may comprise a mixture of the first, second, and third fluorescent materials with a mass ratio of 8:2.5:1.

According to another exemplary embodiment of the present invention, an illumination apparatus is provided and includes a light-emitting device as described above as a light source.

Apparatuses and devices consistent with the present invention provide a light-emitting device having high emission efficacy, excellent long-term reliability and high-temperature properties, and improved color rendering, and an illumination apparatus.

DETAILED DESCRIPTION OF EXEMPLARY EMBODIMENTS OF THE PRESENT INVENTION

Figure 1:
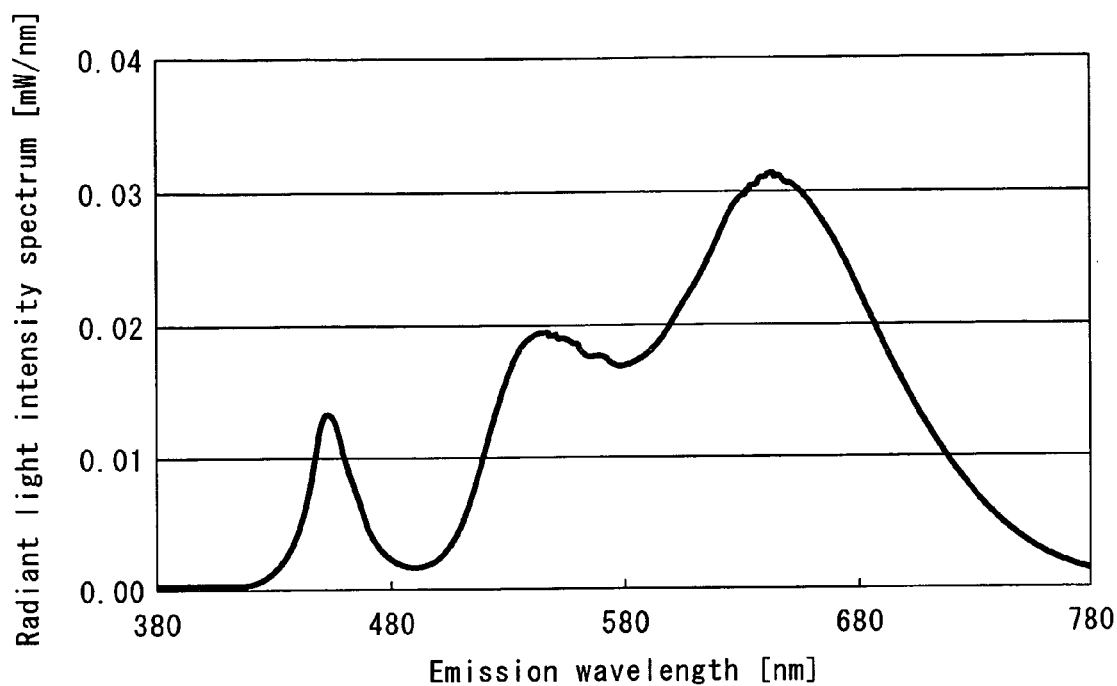
FIG. 1 is a graphical representation showing the emission spectrum of a high color rendering white LED lamp of an Example 1 according to an exemplary embodiment of the present invention.

Examples of the light-emitting device according to exemplary embodiments of the present invention are described hereafter with reference to the drawings. While certain examples of the light-emitting device will be described, these descriptions are of merely exemplary, non-limiting embodiments of the present invention. The present invention is thus not to be considered as being limited by the following description, and is only limited by the scope of the appended claims.

The light-emitting device according to an exemplary embodiment of the present invention comprises a semiconductor light-emitting element that emits blue-violet or blue light and a fluorescent material that absorbs all or a part of the light emitted by the semiconductor light-emitting element and emits fluorescence of wavelengths different from that of the light, wherein the fluorescent material comprises a mixture of a first fluorescent material that emits green or yellow-green light, a second fluorescent material that has a longer emission wavelength than that of the first fluorescent material and emits yellow-green, yellow, or yellow-red light, and a third fluorescent material that has a longer emission wavelength than the second fluorescent material and emits yellow-red or red light, and the first fluorescent material is a europium-activated β-SiAlON fluorescent material, the second fluorescent material is a europium-activated α-SiAlON fluorescent material, and the third fluorescent material is a nitride crystalline red fluorescent material expressed by the general formula of $(Ca,Eu)AlSiN_3$. The α-SiAlON fluorescent material may be expressed by a formula of $Ca_qEu_r(Si,Al)_{12}(O,N)_{16}$ in which q is between about 0.75 and about 1.0 and r is between about 0.03 and about 0.07 and has a primary phase of an α-SiAlON crystalline structure.

The β-SiAlON fluorescent material may be expressed by a formula $Eu_s(Si,Al)_{6-s}(O,N)_8$ in which s is between about 0.011 and about 0.019 and has a primary phase of a β-SiAlON crystalline structure.

Light resulting from the mixture of the light emitted by the semiconductor light-emitting element and the fluorescence emitted by the fluorescent material may have chromaticity within the daylight color range expressed by a rectangle formed on a CIE 1931 XYZ calorimetric system chromaticity diagram by connecting four points at the coordinates (x, y) of (0.3274, 0.3673), (0.3282, 0.3297), (0.2998, 0.3396), and (0.3064, 0.3091).

In such a case, the fluorescent material may comprise a mixture of the first, second, and third fluorescent materials with a mass ratio of (7.5×C/A):(1.3×C/B):1 provided that peak emission intensities of the first, second, and third fluorescent materials are A:B:C, respectively, when measured by a spectrum corrected fluorescence spectrophotometer.

In such a case, the fluorescent material may comprise a mixture of the first, second, and third fluorescent materials with a mass ratio of 12:2:1.

Further, light obtained by mixing the light emitted by the semiconductor light-emitting element and the fluorescence emitted by the fluorescent material may have chromaticity within the neutral white color range expressed by a rectangle formed on a CIE 1931 XYZ colorimetric system chromaticity diagram by connecting four points at the coordinates (x, y) of (0.3616, 0.3875), (0.3552, 0.3476), (0.3353, 0.3659), and (0.3345, 0.3314).

In such a case, the fluorescent material may comprise a mixture of the first, second, and third fluorescent materials with a mass ratio of (6.5×C/A):(1.3×C/B):1 provided that peak emission intensities of the first, second, and third fluorescent materials are A:B:C, respectively, when measured by a spectrum corrected fluorescence spectrophotometer.

In such a case, the fluorescent material may comprise a mixture of the first, second, and third fluorescent materials with a mass ratio of 10.3:2:1.

Further, light obtained by mixing the light emitted by the semiconductor light-emitting element and the fluorescence emitted by the fluorescent material may have chromaticity within the white color range expressed by a rectangle formed on a CIE 1931 XYZ calorimetric system chromaticity diagram by connecting four points at the coordinates (x, y) of (0.3938, 0.4097), (0.3805, 0.3642), (0.3656, 0.3905), and (0.3584, 0.3499).

In such a case, the fluorescent material may comprise a mixture of the first, second, and third fluorescent materials with a mass ratio of (6.3×C/A):(1.9×C/B):1 provided that peak emission intensities of the first, second, and third fluorescent materials are A:B:C, respectively, when measured by a spectrum corrected fluorescence spectrophotometer.

In such a case, the fluorescent material may comprise a mixture of the first, second, and third fluorescent materials with a mass ratio of 10:3:1.

Further, light obtained by mixing the light emitted by the semiconductor light-emitting element and the fluorescence emitted by the fluorescent material may have chromaticity within the warm white color range expressed by a rectangle formed on a CIE 1931 XYZ colorimetric system chromaticity diagram by connecting four points at the coordinates (x, y) of (0.4341, 0.4233), (0.4171, 0.3846), (0.4021, 0.4076), and (0.3903, 0.3719).

In such a case, the fluorescent material may comprise a mixture of the first, second, and third fluorescent materials with a mass ratio of (5.1×C/A):(1.9×C/B):1 provided that peak emission intensities of the first, second, and third fluorescent materials are A:B:C, respectively, when measured by a spectrum corrected fluorescence spectrophotometer.

In such a case, the fluorescent material may comprise a mixture of the first, second, and third fluorescent materials with a mass ratio of 8:3:1.

Further, light obtained by mixing the light emitted by the semiconductor light-emitting element and the fluorescence emitted by the fluorescent material may have chromaticity within the incandescent lamp color range expressed by a rectangle formed on the CIE 1931 XYZ colorimetric system chromaticity diagram by connecting four points at the coordinates (x, y) of (0.4775, 0.4283), (0.4594, 0.3971), (0.4348, 0.4185), and (0.4214, 0.3887).

In such a case, the fluorescent material may comprise a mixture of the first, second, and third fluorescent materials with a mass ratio of (5.1×C/A):(1.6×C/B):1 provided that peak emission intensities of the first, second, and third fluorescent materials are A:B:C, respectively, when measured by a spectrum corrected fluorescence spectrophotometer.

In such a case, the fluorescent material may comprise a mixture of the first, second, and third fluorescent materials with a mass ratio of 8:2.5:1.

Examples of exemplary embodiments of the present invention are described hereafter.

EXAMPLE 1

According to an exemplary embodiment of the present invention, the color rendering of a highly reliable incandescent color LED lamp is improved by adding small amounts of an oxynitride green fluorescent material and a nitride red fluorescent material to a white LED lamp that includes a blue LED element and a europium (Eu)-activated calcium (Ca) doped α-SiAlON fluorescent material and emits white light in the incandescent color range, which is a low color temperature, warm white.

The synthesis of the first fluorescent material or a europium-activated β-SiAlON fluorescent material that emits green or yellow-green light will now be described. Generally, the β-SiAlON is expressed by the general formula $Si_{6-z}Al_zO_zN_{8-z}$. The β-SiAlON fluorescent material is a nitride or oxynitride fluorescent material that is expressed by the general formula $Eu_s(Si,Al)_{6-s}(O,N)_8$ and has a crystalline structure equivalent to the beta $Si_3N_4$ or the β-SiAlON.

Many samples containing $Si_3N_4$, AlN, and $Eu_2O_3$ at different ratios were prepared from raw powders, and the emission properties of the samples were compared. A strong emission intensity was obtained using about 89 mol % of $Si_3N_4$, about 10.7 mol % of AlN, and about 0.3 mol % of $Eu_2O_3$. Table 1 shows the results of some of the experimental samples.

TABLE 1

| | $Si_3N_4$ [mol %] | AlN [mol %] | $Eu_2O_3$ [mol %] | emission intensity |
|---|---|---|---|---|
| Sample G1 | 89.0 | 11.0 | 0.0 | 209 |
| Sample G2 | 89.0 | 10.9 | 0.1 | 845 |
| Sample G3 | 89.0 | 10.8 | 0.2 | 1323 |
| Sample G4 | 89.0 | 10.7 | 0.3 | 2249 |
| Sample G5 | 89.0 | 10.6 | 0.4 | 1897 |
| Sample G6 | 89.0 | 10.5 | 0.5 | 1446 |
| Sample G7 | 89.0 | 10.4 | 0.6 | 1537 |
| Sample G8 | 89.0 | 10.3 | 0.7 | 1033 |

Sample G4 having 0.3 mol % of $Eu_2O_3$ exhibited the largest emission intensity. It is concluded that a strong emission intensity can be obtained using about 0.25 to about 0.45 mol % of $Eu_2O_3$. This corresponds to the general formula $Eu_s(Si,Al)_{6-s}(O,N)_8$, which yields advantageous properties with about $0.011 \leqq s \leqq$ about 0.019 and yields excellent properties when s=about 0.013.

Based on the experimental results, the composition including 89 mol % of $Si_3N_4$, 10.7 mol % of AlN, and 0.3 mol % of $Eu_2O_3$ was selected. The raw powders included silicon nitride, aluminum nitride, and europium oxide powders. In order to obtain the above composition, 95.82% by mass of silicon nitride powder, 3.37% by mass of aluminum nitride powder, and 0.81% by mass of europium oxide powder were weighed to a batch of 50 g and, with the addition of n-hexane, mixed in a wet planetary ball mill for two hours. Then, the raw powder mixture was dried in a rotary evaporator, sufficiently disintegrated in a mortar, granulated to an appropriate particle size using a nominal aperture 125 μm stainless test sieve compliant to JIS Z 8801, and stored in a boron nitride container with a lid. Subsequently, the covered container containing the raw powders was introduced in a gas pressurized sintering furnace, sintered under gas pressure at a sintering temperature of 2000° C. and in a nitrogen atmosphere of 1 MPa for two hours, and then sintered under gas pressure at a sintering temperature of 1700° C. and in a nitrogen atmosphere of 0.5 MPa for a further 24 hours. The sintered raw powders had a mass form, which was crushed to a powder form with a small force to obtain fluorescent powder. A chart obtained by an X-ray powder diffraction method using the Kα line of Cu confirmed the β-SiAlON crystalline phase.

The synthesis of the second fluorescent material or a europium-activated α-SiAlON fluorescent material that has a longer emission wavelength than that of the first fluorescent material and emits yellow-green, yellow, or yellow-red light will now be described. This α-SiAlON fluorescent material is a calcium (Ca) doped α-SiAlON fluorescent material activated by divalent europium (Eu) and has a composition expressed by the general formula of $Ca_q(Si,Al)_{12}(O,N)_{16}:Eu^{2+}_r$. Many samples with varied q and r were prepared, and their emission properties were compared. Among these, the compositions with about $0.75 \leqq q \leqq$ about 1.0 and about $0.03 \leqq r \leqq$ about 0.07 exhibited strong emission intensities, and the luminescent chromaticity of these compositions was suitable for a white LED lamp.

Based on the experimental results, a composition with q=0.875 and r=0.07 was selected. The raw powders included silicon nitride, aluminum nitride, calcium carbonate, and europium oxide powders. In order to obtain a composition formula of $Ca_{0.875}Si_{9.06}Al_{2.94}O_{0.98}N_{15.02}:Eu^{2+}_{0.07}$, 65.78% by mass of silicon nitride powder, 18.71% by mass of aluminum nitride powder, 13.59% by mass of calcium carbonate powder, and 1.91% by mass of europium oxide powder were weighed to a batch of 50 g and, with the addition of n-hexane, mixed in a wet planetary ball mill for two hours. The raw powder mixture was then dried in a rotary evaporator, sufficiently disintegrated in a mortar, granulated to an appropriate particle size using a nominal aperture 125 μm stainless test sieve compliant to JIS Z 8801, and stored in a boron nitride container with a lid. Subsequently, the covered container containing the raw powders was introduced in a gas pressurized sintering furnace, sintered under gas pressure at a sintering temperature of 1700° C. and in a nitrogen atmosphere of 0.5 MPa for 24 hours. The sintered raw powders had a mass form, which was crushed to a powder form with a small force to obtain fluorescent powder. A chart obtained by an X-ray powder diffraction method using the Kα line of Cu confirmed the calcium doped α-SiAlON crystalline phase.

The third fluorescent material is a nitride crystalline red fluorescent material that has a longer emission wavelength than the second fluorescent material and emits yellow-red or red light and is expressed by the general formula of (Ca, Eu)$AlSiN_3$. The synthesis of the third fluorescent material will now be described. The raw powders were silicon nitride powder, aluminum nitride powder, calcium nitride powder, and europium nitride obtained by nitridation of metal europium in ammonium. In order to obtain a composition formula of $Eu_{0.0005}Ca_{0.9995}AlSiN_3$, 34.0735% by mass of silicon nitride powder, 29.8705% by mass of aluminum nitride powder, 35.9956% by mass of calcium nitride powder, and 0.06048% by mass of europium nitride powder were weighed and mixed for 30 minutes using an agate mortar and a pestle. The obtained mixture was molded using a metal mold under a pressure of 20 MPa to yield a molded piece of 12 mm in diameter and 5 mm in thickness. Weighing, mixing, and molding the powders were conducted in a glove box where an atmosphere of nitrogen with moisture of 1 ppm or less and oxygen of 1 ppm or less was maintained. The molded piece was placed in a boron nitride crucible and introduced in a graphite resistance heating type electric furnace. For firing, a vacuum firing atmosphere was created using a diffusion pump and heated from the room temperature to 800° C. at a rate of 500° C. per hour. At the temperature of 800° C., 99.999% by volume pure nitrogen was introduced to a pressure of 1 MPa, heated to 1800° C. at a rate of 500° C. per hour, and maintained at 1800° C. for two hours. After firings, the sintered piece was disintegrated to a powder form using an agate mortar and a pestle to obtain fluorescent powder. A chart obtained by X-ray powder diffraction method using the Kα line of Cu confirmed the $CaAlSiN_3$ crystalline phase.

Optical properties of the first, second, and third fluorescent materials prepared as described above are described hereafter. Measurements were obtained using a fluorescence spectrophotometer F-4500 manufactured by Hitachi, Ltd. The spectrophotometer was calibrated by the rhodamine B method and a standard light source for spectral correction.

Figure 8:
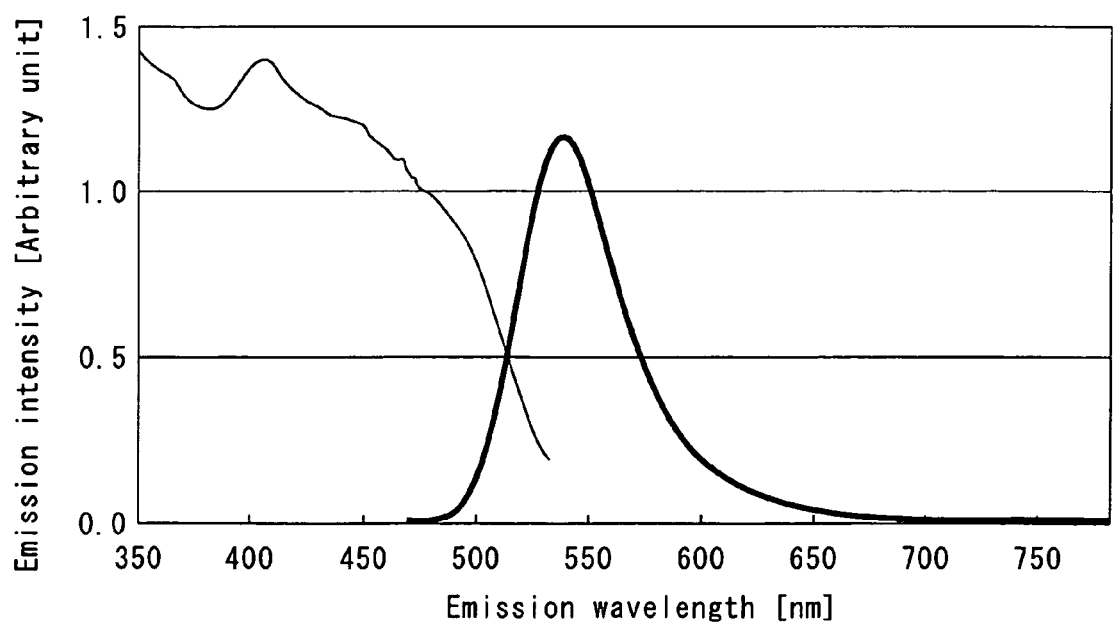
FIG. 8 is a graphical representation showing the emission spectrum and the excitation spectrum of a β-SiAlON fluorescent material used as the first fluorescent material according to an exemplary embodiment of the present invention.
Figure 9:
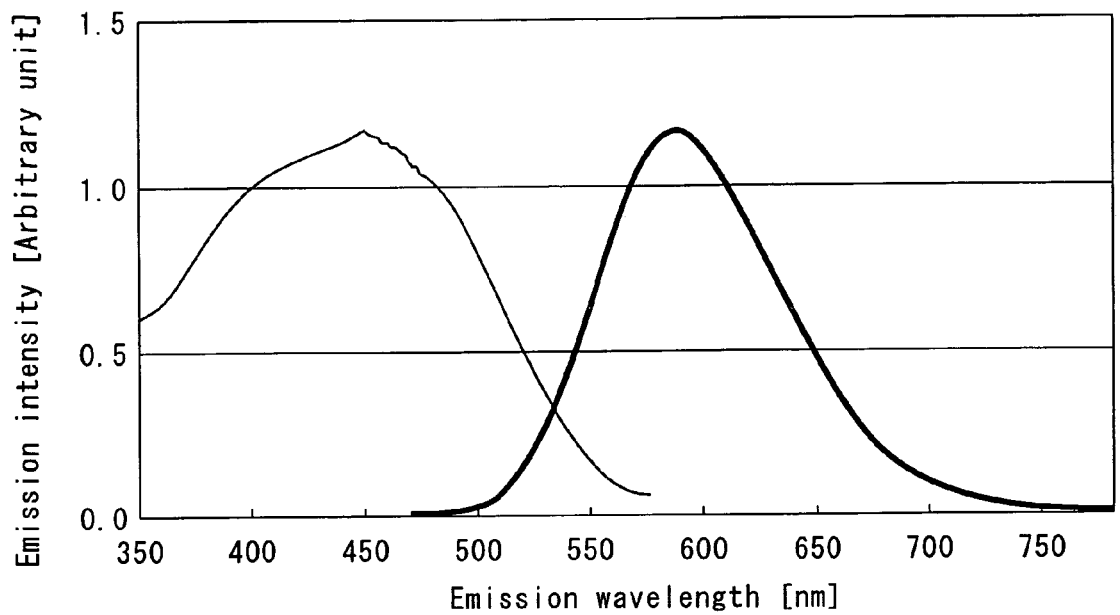
FIG. 9 is a graphical representation showing the emission spectrum and the excitation spectrum of an α-SiAlON fluorescent material used as the second fluorescent material according to an exemplary embodiment of the present invention.
Figure 10:
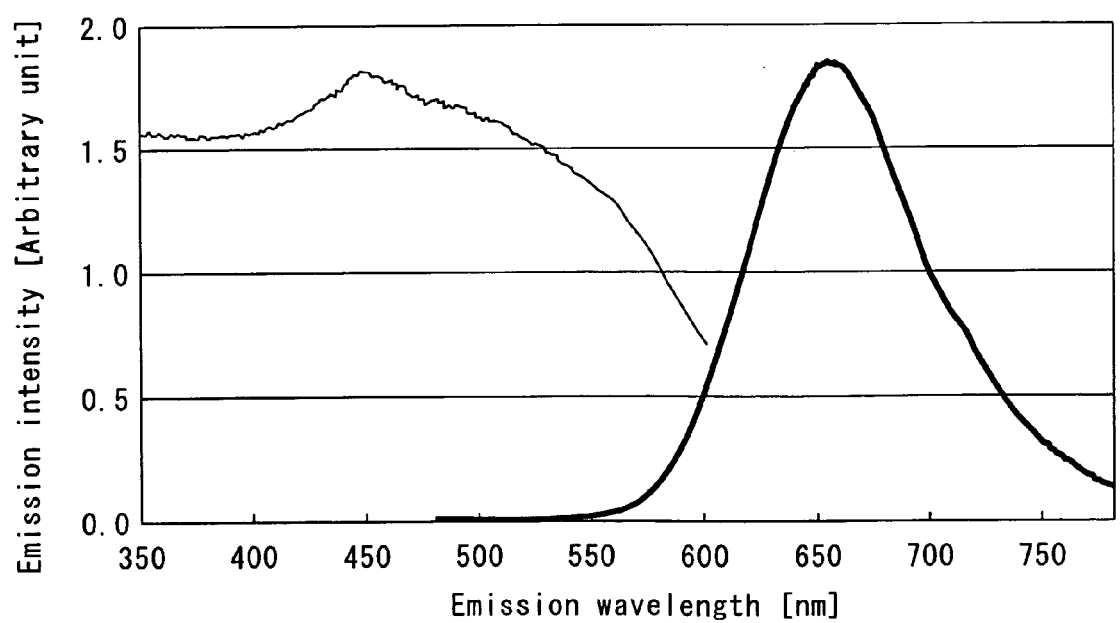
FIG. 10 is a graphical representation showing the emission spectrum and the excitation spectrum of a $Ca_{1-p}AlSiN_3:Eu^{2+}_p$ fluorescent material used as the third fluorescent material according to an exemplary embodiment of the present invention.

Assuming excitation by a blue LED, an excitation wavelength of 450 nm was used to measure emission spectra. The peak emission wavelength of each fluorescent material was used as a monitoring wavelength to measure excitation spectra. In FIGS. 8 to 10, the emission intensity on the vertical axis was normalized with the peak emission intensity of a reference fluorescent material being 1. The reference fluorescent material was a commercially available $(Y,Gd)_3Al_5O_{12}:Ce^{3+}$ fluorescent powder (a YAG fluorescent material), which was used in Comparative Example 1 above.

For the excitation wavelength of 450 nm, the first fluorescent material or a β-SiAlON fluorescent material had a central emission wavelength of about 539 nm; the second fluorescent material or an α-SiAlON fluorescent material had a central emission wavelength of about 585 nm; and the third fluorescent material or a $Ca_{1-p}AlSiN_3:Eu^{2+}_p$ fluorescent material has a central emission wavelength of about 655 nm.

As for the excitation spectrum, all of the fluorescent materials had a significantly wide excitation range from the blue to ultraviolet light range. It was found that the second fluorescent material or an α-SiAlON fluorescent material and the third fluorescent material or a $Ca_{1-p}AlSiN_3:Eu^{2+}_p$ fluorescent material may be highly efficiently excited particularly by blue light of wavelengths around 450 nm. The first fluorescent material or a β-SiAlON fluorescent material exhibited a sufficiently high excitation efficiency for a wavelength of 450 nm. However, it was found that shorter wavelengths may be advantageously used for higher excitation efficiency.

Figure 11:
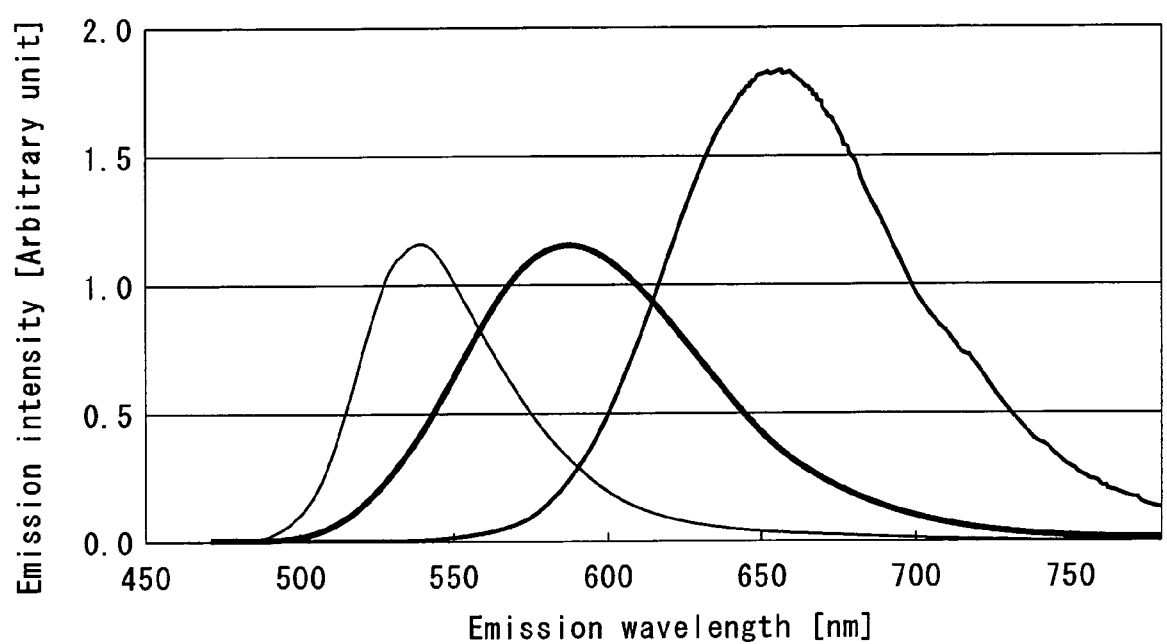
FIG. 11 is a graphical representation showing the emission spectra of the β-SiAlON fluorescent material, α-SiAlON fluorescent material, and $Ca_{1-p}AlSiN_3:Eu^{2+}_p$ fluorescent material according to an exemplary embodiment of the present invention.

Assuming that the peak emission intensity of the reference material to be 100%, the first fluorescent material, that is, a β-SiAlON fluorescent material had a peak emission intensity of about 117%; the second fluorescent material, that is, an α-SiAlON fluorescent material had a peak emission intensity of about 116%; and the third fluorescent material, that is, a $Ca_{1-p}AlSiN_3:Eu^{2+}_p$ fluorescent material has a peak emission intensity of about 184%. FIG. 11 is a graphical representation showing the emission spectra of the first to third fluorescent materials according to an exemplary embodiment of the present invention for comparison.

Figure 13:
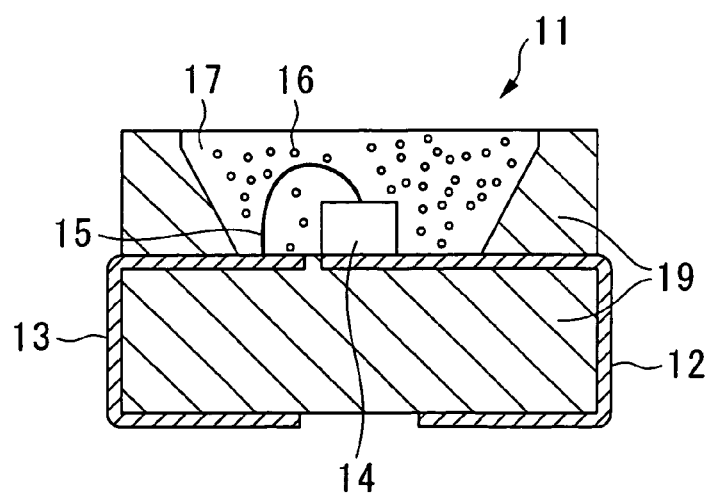
FIG. 13 is a cross-sectional view of a chip type white LED lamp according to an exemplary embodiment of the present invention.

As the light-emitting device of Example 1, the structure of a white LED lamp using a mixture of the first to third fluorescent materials is described hereafter. FIG. 13 shows a chip type light-emitting diode lamp 11. A white resin package 19 clamps two lead wires 12 and 13 and has a recess in the center. In the recess, the ends of the lead wires 12 and 13 are exposed and a blue LED element 14 having a peak emission wavelength of about 450 nm is placed. The bottom electrode of the blue LED element 14 and the end of one lead wire 12 are electrically coupled by conductive paste. The top electrode of the blue LED element 14 and the other lead wire 13 are electrically coupled by a bonding wire 15 made of a thin gold wire, or other such bonding wire known in the art. Fluorescent powder 16 obtained by mixing the first, second, and third fluorescent materials is dispersed in a transparent resin 17 and the resin 17 with the fluorescent powder 16 dispersed therein entirely covers the blue LED element 14 and seals the whole recess including the lead wires 12 and 13.

The blue LED element advantageously has-a central emission wavelength of about 400 nm to about 480 nm, and preferably, but not necessarily, a central emission wavelength of 450 nm for efficiently exciting the second fluorescent material or an α-SiAlON fluorescent material and the third fluorescent material or a $Ca_{1-p}AlSiN_3:Eu^{2+}_p$ fluorescent material.

The production process of the light-emitting device of Example 1 is described hereafter.

The first, second, and third fluorescent materials were weighed and mixed, as described above.

The blue LED element 14 having a peak emission wavelength of about 450 nm was die bonded to the end of one lead wire 12 using conductive paste.

The top electrode of the blue LED element 14 and the other lead wire 13 were wire-bonded by a thin gold wire.

An appropriate amount of the resin 17 in which the fluorescent powder mixture 16 was dispersed to 17% by mass was applied and cured in the recess to cover the blue LED element 14. Here, the appropriate application amount was previously determined by experiments. The resin was an epoxy resin, although other similar resins known in the art are also contemplated.

Example 1 used the first, second, and third fluorescent materials with a mixing ratio of 8:2.5:1, achieving luminescent chromaticity of incandescent lamp color. The incandescent lamp color range is expressed by a rectangle formed on the CIE 1931 XYZ colorimetric system chromaticity diagram by connecting four points at the coordinates (x, y) of (0.4775, 0.4283), (0.4594, 0.3971), (0.4348, 0.4185), and (0.4214, 0.3887).

Figure 14:
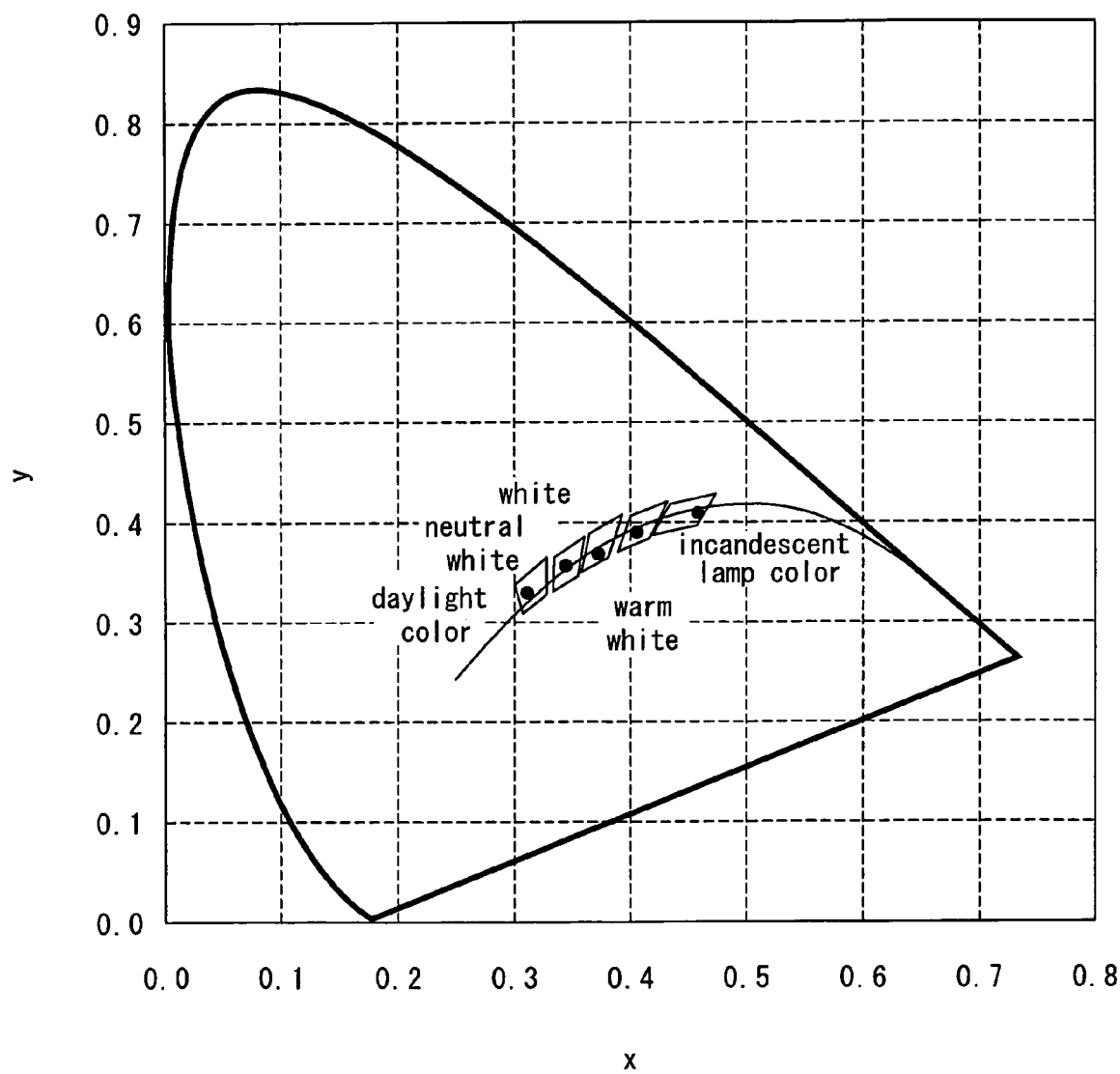
FIG. 14 is a graphical representation showing a CIE 1931 XYZ colorimetric system chromaticity diagram showing chromaticity regions of exemplary embodiments of the present invention.

The incandescent lamp color LED lamp of Example 1 according to an exemplary embodiment of the present invention exhibited an incandescent lamp color of which the coordinates (x, y) on the CIE 1931 XYZ calorimetric system chromaticity diagram shown in FIG. 14 were (0.460, 0.409) and had a correlated color temperature of about 2690 K. The emission efficacy to input power was about 20.5 lm/W and the general color rendering index Ra was about 89. FIG. 1 shows the emission spectrum of the incandescent lamp color LED lamp of Example 1 according to an exemplary embodiment of the present invention.

The first to third fluorescent materials used in Example 1 are still in the process of review for improved optical properties and their emission intensities may be further improved in the future. The fluorescent materials used in Example 1 described above had the emission spectra having the relationships shown in FIG. 11. As the fluorescent materials are improved in emission intensity and their proportions are changed, the mixing ratio of the first to third fluorescent materials has to be reviewed in order to verify that the white LED lamp yields luminescent chromaticity of incandescent color. For example, the mixing ratio can be (5.1×C/A):(1.6×C/B):1 provided that peak emission intensities of the first to third fluorescent materials are A:B:C, respectively, when measured by a spectrum corrected fluorescence spectrophotometer.

EXAMPLE 2

Example 2 was produced according to an exemplary embodiment of the present invention. Example 2 used the first, second, and third fluorescent materials with a mixing ratio of 12:2:1, achieving luminescent chromaticity of daylight color. The daylight color range is expressed by a rectangle formed on the CIE 1931 XYZ calorimetric system chromaticity diagram by connecting four points at the coordinates (x, y) of (0.3274, 0.3673), (0.3282, 0.3297), (0.2998, 0.3396), and (0.3064, 0.3091). A white LED lamp was produced in the same manner as in Example 1 except that the fluorescent materials were mixed at the changed mixing ratio and the measurements were obtained in the same manner as in Example 1.

Figure 4:
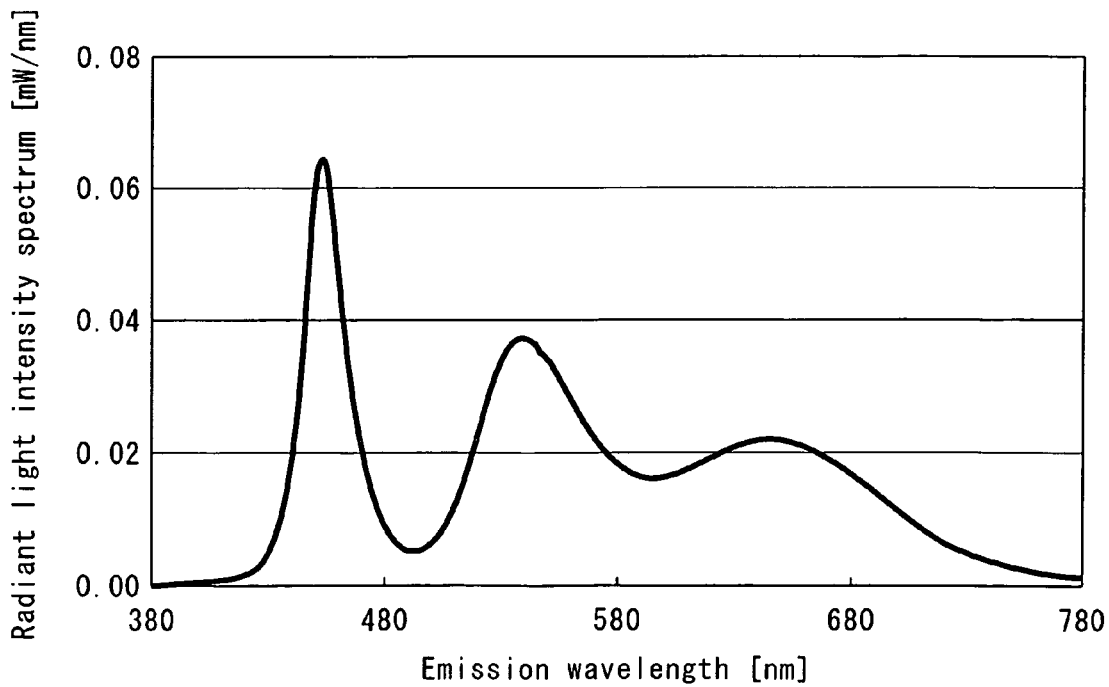
FIG. 4 is a graphical representation showing the emission spectrum of a high color rendering white LED lamp of Example 2 according to an exemplary embodiment of the present invention.

The white LED lamp of Example 2 according to an exemplary embodiment of the present invention exhibited a daylight color of which the coordinates (x, y) on the CIE 1931 XYZ colorimetric system chromaticity diagram shown in FIG. 14 were (0.311, 0.333) and had a correlated color temperature of about 6580 K. The emission efficacy to input power was about 28.0 lm/W and the general color rendering index Ra was about 81. FIG. 4 shows the emission spectrum of the white LED lamp of Example 2.

The first to third fluorescent materials used in Example 2 are still in the process of review for improved optical properties and their emission intensities may be further improved in the future. The fluorescent materials used in Example 2 described above had the emission spectra having the relationships shown in FIG. 11. As the fluorescent materials are improved in emission intensity and their proportions are changed, the mixing ratio of the first to third fluorescent materials has to be reviewed in order to verify that the white LED lamp yields luminescent chromaticity of daylight color. For example, the mixing ratio can be (7.5×C/A):(1.3×C/B):1 provided that peak emission intensities of the first to third fluorescent materials are A:B:C, respectively, when measured by a spectrum corrected fluorescence spectrophotometer.

EXAMPLE 3

Example 3 was produced according to an exemplary embodiment of the present invention. Example 3 used the first, second, and third fluorescent materials with a mixing ratio of 10.3:2:1, achieving luminescent chromaticity of neutral white color. The neutral white color range is expressed by a rectangle formed on the CIE 1931 XYZ calorimetric system chromaticity diagram by connecting four points at the coordinates (x, y) of (0.3616, 0.3875), (0.3552, 0.3476), (0.3353, 0.3659), and (0.3345, 0.3314). A white LED lamp was produced in the same manner as in Example 1 except that the fluorescent materials were mixed at the changed mixing ratio and the measurements were obtained in the same manner as in Example 1.

Figure 5:
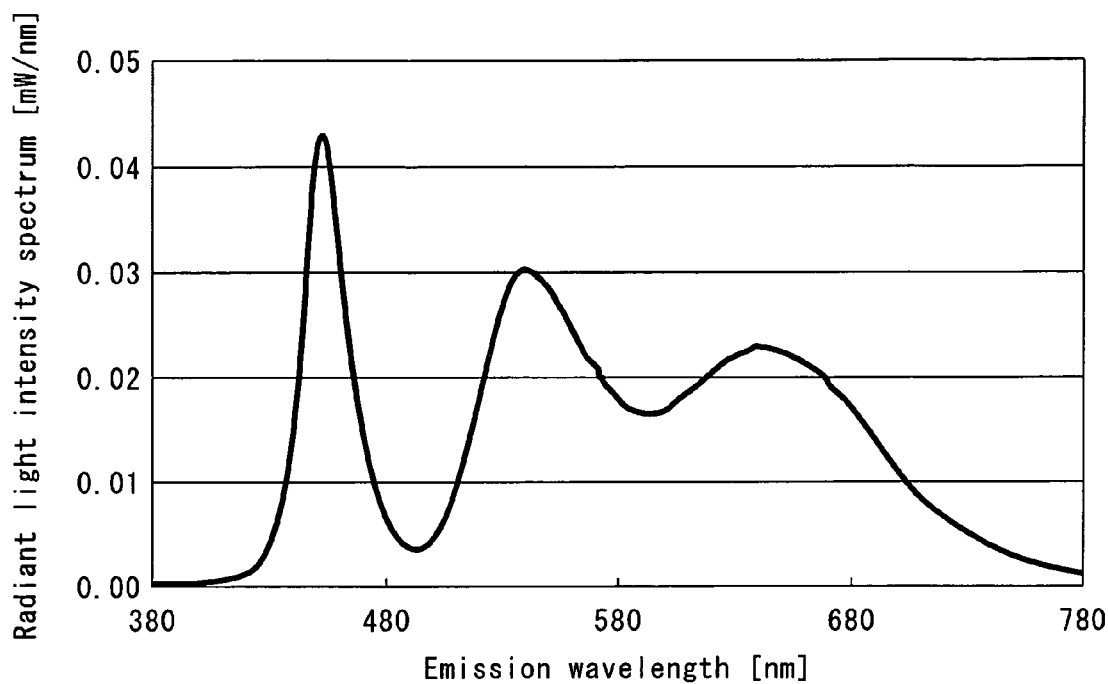
FIG. 5 is a graphical representation showing the emission spectrum of a high color rendering white LED lamp of an Example 3 according to an exemplary embodiment of the present invention.

The white LED lamp of Example 3 according to an exemplary embodiment of the present invention exhibited a neutral white color of which the coordinates (x, y) on the CIE 1931 XYZ colorimetric system chromaticity diagram shown in FIG. 14 were (0.345, 0.358) and had a correlated color temperature of about 5010 K. The emission efficacy to input power was about 25.3 lm/W and the general color rendering index Ra was about 82. FIG. 5 shows the emission spectrum of the white LED lamp of Example 3.

The first to third fluorescent materials used in Example 3 are still in the process of review for improved optical properties and their emission intensities may be further improved in the future. The fluorescent materials used in Example 3 described above had the emission spectra having the relationships shown in FIG. 11. As the fluorescent materials are improved in emission intensity and their proportions are changed, the mixing ratio of the first to third fluorescent materials has to be reviewed in order to verify that the white LED lamp yields luminescent chromaticity of neutral white color. For example, the mixing ratio can be $(6.5 \times C/A):(1.3 \times C/B):1$ provided that peak emission intensities of the first to third fluorescent materials are A:B:C, respectively, when measured by a spectrum corrected fluorescence spectrophotometer.

EXAMPLE 4

Example 4 used the first, second, and third fluorescent materials with a mixing ratio of 10:3:1, achieving luminescent chromaticity of white color. The white color range is expressed by a rectangle formed on the CIE 1931 XYZ calorimetric system chromaticity diagram by connecting four points at the coordinates (x, y) of (0.3938, 0.4097), (0.3805, 0.3642), (0.3656, 0.3905), and (0.3584, 0.3499). A white LED lamp was produced in the same manner as in Example 1 except that the fluorescent materials were mixed at the changed mixing ratio and the measurements were obtained in the same manner as in Example 1.

Figure 6:
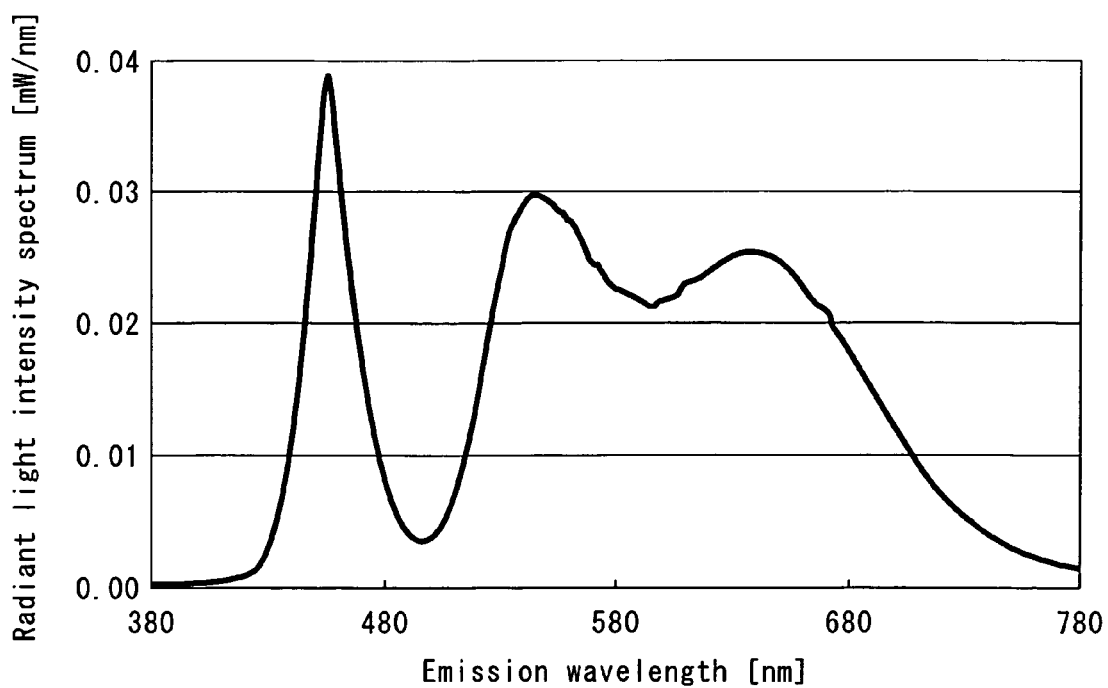
FIG. 6 is a graphical representation showing the emission spectrum of a high color rendering white LED lamp of an Example 4 according to an exemplary embodiment of the present invention.

The white LED lamp of Example 4 according to an exemplary embodiment of the present invention exhibited a white color of which the coordinates (x, y) on the CIE 1931 XYZ calorimetric system chromaticity diagram shown in FIG. 14 were (0.373, 0.370) and had a correlated color temperature of about 4160 K. The emission efficacy to input power was about 27.1 lm/W and the general color rendering index Ra was about 83. FIG. 6 shows the emission spectrum of the white LED lamp of Example 4.

The first to third fluorescent materials used in Example 4 are still in the process of review for improved optical properties and their emission intensities may be further improved in the future. The fluorescent materials used in Example 4 described above had the emission spectra having the relationships shown in FIG. 11. As the fluorescent materials are improved in emission intensity and their proportions are changed, the mixing ratio of the first to third fluorescent materials has to be reviewed in order to verify that the white LED lamp yields luminescent chromaticity of white color. For example, the mixing ratio can be $(6.3 \times C/A):(1.9 \times C/B):1$ provided that peak emission intensities of the first to third fluorescent materials are A:B:C, respectively, when measured by a spectrum corrected fluorescence spectrophotometer.

EXAMPLE 5

Example 5 used the first, second, and third fluorescent materials with a mixing ratio of 8:3:1, achieving luminescent chromaticity of warm white color. The warm white color range is expressed by a rectangle formed on the CIE 1931 XYZ colorimetric system chromaticity diagram by connecting four points at the coordinates (x, y) of (0.4341, 0.4233), (0.4171, 0.3846), (0.4021, 0.4076), and (0.3903, 0.3719). A white LED lamp was produced in the same manner as in Example 1 except that the fluorescent materials were mixed at the changed mixing ratio and the measurements were obtained in the same manner as in Example 1.

Figure 7:
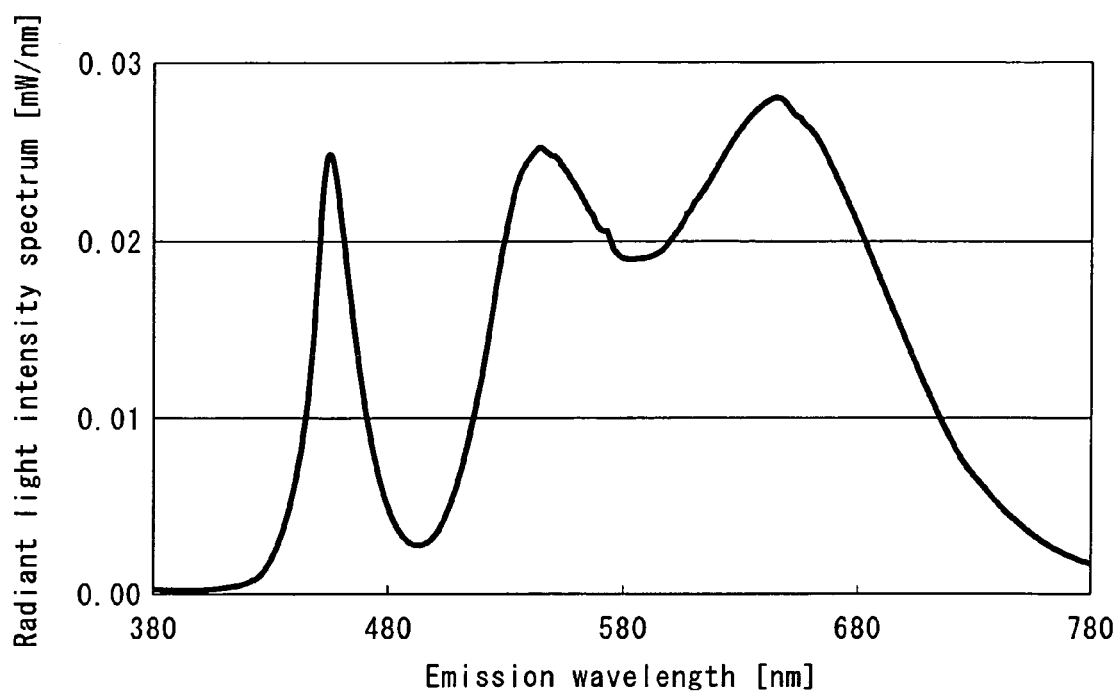
FIG. 7 is a graphical representation showing the emission spectrum of a high color rendering white LED lamp of an Example 5 according to an exemplary embodiment of the present invention.

The white LED lamp of Example 5 according to an exemplary embodiment of the present invention exhibited a warm white color of which the coordinates (x, y) on the CIE 1931 XYZ colorimetric system chromaticity diagram shown in FIG. 14 were (0.407, 0.392) and had a correlated color temperature of about 3470 K. The emission efficacy to input power was about 23.7 lm/W and the general color rendering index Ra was about 86. FIG. 7 shows the emission spectrum of the white LED lamp of Example 5.

The first to third fluorescent materials used in Example 5 are still in the process of review for improved optical properties and their emission intensities may be further improved in the future. The fluorescent materials used in Example 5 described above had the emission spectra having the relationships shown in FIG. 11. As the fluorescent materials are improved in emission intensity and their proportions are changed, the mixing ratio of the first to third fluorescent materials has to be reviewed in order to verify that the white LED lamp yields luminescent chromaticity of white color. For example, the mixing ratio can be $(5.1 \times C/A):(1.9 \times C/B):1$ provided that the peak emission intensities of the first to third fluorescent materials are A:B:C when measured by a spectrum corrected fluorescence spectrophotometer.

The white LED lamps (light-emitting devices) according to exemplary embodiments of the present invention and produced in Examples 1 to 5 described above were of a chip type white LED lamp. However, they can be of other types of light-emitting devices such as a bullet type white LED lamp shown in FIG. 12, or other type of light-emitting device known in the art.

The light-emitting device according to any of the exemplary embodiments of the present invention is suitable for use in an illumination apparatus by itself or by mounting a plurality of such devices on a substrate. Moreover, it is contemplated that the light-emitting device may be using in an illumination apparatus along with additional circuitry. The illumination apparatus using the light-emitting device according to any of the exemplary embodiments of the present invention as a light source has advantages such as small size, energy-saving, high luminance, long life, and high color rendering.

COMPARATIVE EXAMPLE 1

Figure 12:
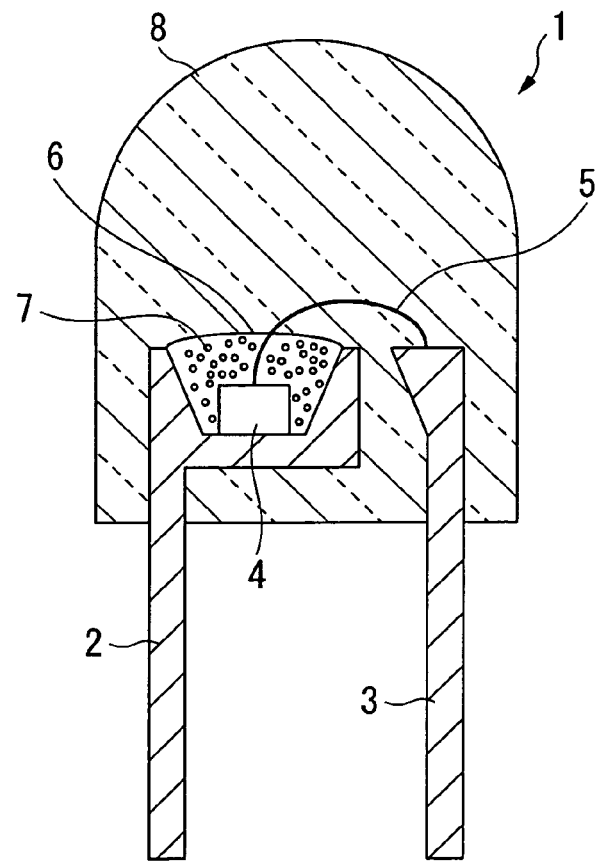
FIG. 12 is a cross-sectional view of a bullet type white LED lamp according to an exemplary embodiment of the present invention.

For comparison, a conventional bullet type white LED lamp shown in FIG. 12 was produced using a commercially available YAG fluorescent material as the fluorescent material.

A bullet type LED lamp 1 has an approximately cylinder shape with a rounded top, in other words a bullet-like shape, and comprises two lead wires 2 and 3, a blue LED element 4 emitting blue light, a bonding wire 5, a fluorescent material 7, a first resin 6 mixed with the fluorescent material 7, and a second, transparent resin 8. A recess is formed at the top end of one lead wire 2 and the blue LED element 4 is placed in the recess. The bottom electrode of the blue LED element 4 is electrically coupled to the one lead wire 2, for example, by die bonding using conductive paste. The top electrode of the blue LED element 4 is electrically coupled to the other lead wire 3, for example, by wire bonding using a bonding wire 5. The blue LED element 4 and bonding wire 5 within the recess are embedded in the first resin mixed with the fluorescent material 7. These components are sealed in the transparent resin 8 molded in a bullet shape except for the lower parts of both lead wires 2 and 3.

Figure 2:
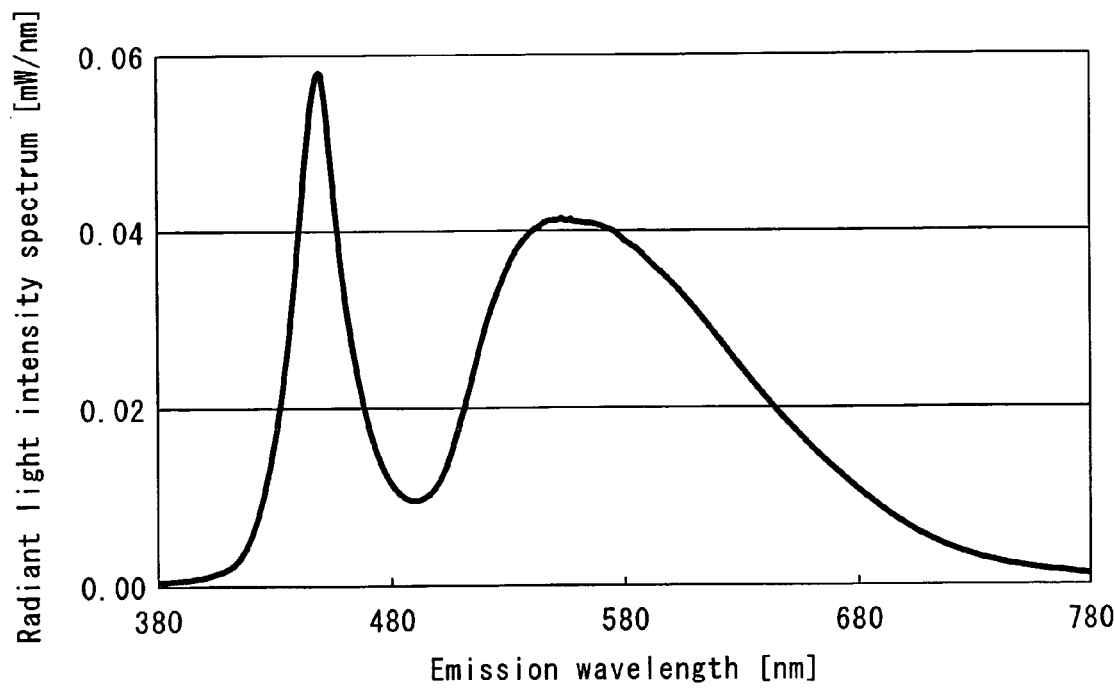
FIG. 2 is a graphical representation showing the emission spectrum of a conventional white LED lamp of a Comparative Example 1.

In Comparative Example 1, the fluorescent material 7 used was a commercially available $(Y,Gd)_3Al_5O_{12}:Ce^{3+}$ fluorescent powder (YAG fluorescent material). FIG. 2 shows the emission spectrum of the white LED lamp of Comparative Example 1. The emission color had chromaticity coordinates (x, y)=(0.34, 0.36) on a CIE 1931 XYZ calorimetric system chromaticity diagram and a correlated color temperature of 5070 K. The general color rendering index Ra was 73 and the luminous efficacy to input power was 40 lm/W (lumen per watt). The white LED lamp of Comparative Example 1 is an light-emitting device that efficiently emits white light. However, it is difficult to shift the emission wavelength for longer wavelengths by using the YAG fluorescent material. Therefore, a white LED lamp that emits low color temperature white light in the light source color chromaticity range of incandescent lamp color defined by JIS Z 9112-1990 cannot be realized. It is known that the YAG fluorescent material has lowered emission intensity at high temperatures. Color changes due to environmental temperature changes are also problematic. Further improvement in color rendering is also required.

COMPARATIVE EXAMPLE 2

Figure 3:
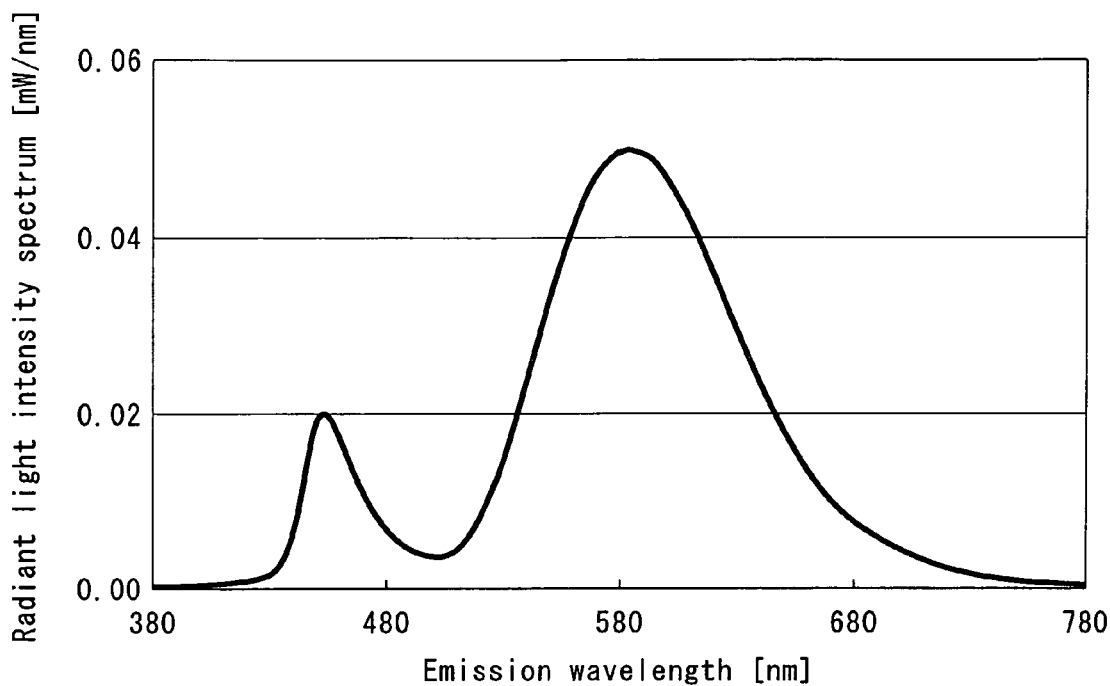
FIG. 3 is a graphical representation showing the emission spectrum of a conventional white LED lamp of a Comparative Example 2.

Comparative Example 2 was different from Comparative Example 1 in that the fluorescent material 7 was an α-SiAlON fluorescent material. FIG. 3 shows the emission spectrum of a white LED lamp of Comparative Example 2 using an α-SiAlON fluorescent material having a composition formula of $Ca_{0.875}(Si,Al)_{12}(O,N)_{16}Eu^{2+}_{0.07}$.

The emission color had chromaticity coordinates (x, y)= (0.46, 0.41) on the CIE 1931 XYZ colorimetric system chromaticity diagram and a correlated color temperature of 2780 K. The general color rendering index was 56 and the luminous efficacy to input power was 36 lm/W (lumen per watt). The white LED lamp of Comparative Example 2 using an α-SiAlON fluorescent material, or an oxynitride fluorescent material, is a light-emitting device that efficiently emits low color temperature white light in the light source color chromaticity range of incandescent lamp color. It also exhibits strong color stability over temperature changes as disclosed in K. Sakuma, K. Omichi, N. Kimura, M. Ohashi, D. Tanaka, N. Hirosaki, Y. Yamamoto, R. -J. Xie, T. Suehiro, "Warm-white light-emitting diode with yellowish orange SiAlON ceramic phosphor," Opt. Lett., Vol. 29, pp. 2001-2003 (2004). However, the white LED lamp of Comparative Example 2 is slightly behind general fluorescent lamps in color rendering, and improvement is required.

While certain exemplary embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A light-emitting device comprising:
   a semiconductor light-emitting element that emits blue-violet or blue light; and
   a fluorescent material that absorbs all or a part of the blue-violet or blue light emitted by the semiconductor light-emitting element and emits fluorescence of wavelengths different from that of the blue-violet or blue light,
   wherein the fluorescent material comprises a mixture of a first fluorescent material that emits green or yellow-green light, a second fluorescent material that has a longer emission wavelength than that of the first fluorescent material and emits yellow-green, yellow, or yellow-red light, and a third fluorescent material that has a longer emission wavelength than the second fluorescent material and emits yellow-red or red light, and
   the first fluorescent material is a europium-activated β-SiAlON fluorescent material, the second fluorescent material is a europium-activated α-SiAlON fluorescent material, and the third fluorescent material is a nitride crystalline red fluorescent material expressed by a general formula of $(Ca,Eu)AlSiN_3$.

2. A light-emitting device comprising:
   a semiconductor light-emitting element that emits blue-violet or blue light; and
   a fluorescent material that absorbs all or a part of the blue-violet or blue light emitted by the semiconductor light-emitting element and emits fluorescence of wavelengths different from that of the blue-violet or blue light,
   wherein the fluorescent material comprises a mixture of a first fluorescent material that emits green or yellow-green light, a second fluorescent material that has a longer emission wavelength than that of the first fluorescent material and emits yellow-green, yellow, or yellow-red light, and a third fluorescent material that has a longer emission wavelength than the second fluorescent material and emits yellow-red or red light,
   the first fluorescent material is a europium-activated β-SiAlON fluorescent material, the second fluorescent material is a europium-activated α-SiAlON fluorescent material, and the third fluorescent material is a nitride crystalline red fluorescent material expressed by the general formula of $(Ca,Eu)AlSiN_3$, and
   the α-SiAlON fluorescent material is expressed by a formula of $Ca_qEu_r(Si,Al)_{12}(O,N)_{16}$ in which q is between about 0.75 and about 1.0 and r is between about 0.03 and about 0.07 and has a primary phase of an α-SiAlON crystalline structure.

3. A light-emitting device comprising: a semiconductor light-emitting element that emits blue-violet or blue light; and a fluorescent material that absorbs all or a part of the blue-violet or blue light emitted by the semiconductor light-emitting element and emits fluorescence of wavelengths different from that of the blue-violet or blue light, wherein
   the fluorescent material comprises a mixture of a first fluorescent material that emits green or yellow-green light, a second fluorescent material that has a longer emission wavelength than that of the first fluorescent material and emits yellow-green, yellow, or yellow-red light, and a third fluorescent material that has a longer emission wavelength than the second fluorescent material and emits yellow-red or red light, the first fluorescent material is a europium-activated β-SiAlON fluorescent material, the second fluorescent material is a europium-activated α-SiAlON fluorescent material, and the third fluorescent material is a nitride crystalline red fluorescent material expressed by the general formula of (Ca,Eu)AlSiN$_3$, and the β-SiAlON fluorescent material is expressed by a formula Eu$_s$(Si,Al)$_{6-s}$(O,N)$_8$ in which s is between about 0.011 and about 0.019 and has a primary phase of a β-SiAlON crystalline structure.

4. The light-emitting device according to any one of claims 1 to 3, wherein light obtained by mixing the light emitted by the semiconductor light-emitting element and the fluorescence emitted by the fluorescent material has chromaticity expressed by a rectangle formed on a CIE 1931 XYZ colorimetric system chromaticity diagram by connecting a first point at the coordinates of x=0.3274 and y=0.3673, a second point at the coordinates of x=0.3282 and y=0.3297, a third point at the coordinates of x=0.2998 and y=0.3396, and a fourth point at the coordinates of x=0.3064 and y=0.3091.

5. The light-emitting device according to claim 4, wherein the fluorescent material comprises a mixture of the first, second, and third fluorescent materials with a mass ratio of (7.5×C/A):(1.3×C/B):1 provided that peak emission intensities of the first, second, and third fluorescent materials are A:B:C, respectively, when measured by a spectrum corrected fluorescence spectrophotometer.

6. The light-emitting device according to claim 4, wherein the fluorescent material comprises a mixture of the first, second, and third fluorescent materials with a mass ratio of 12:2:1.

7. The light-emitting device according to claim 4, wherein the chromaticity is within a daylight color range.

8. The light-emitting device according to any one of claims 1 to 3, wherein light obtained by mixing the light emitted by the semiconductor light-emitting element and the fluorescence emitted by the fluorescent material has chromaticity expressed by a rectangle formed on a CIE 1931 XYZ colorimetric system chromaticity diagram by connecting a first point at the coordinates of x=0.3616 and y=0.3875, a second point at the coordinates of x=0.3552 and y=0.3476, a third point at the coordinates of x=0.3353 and y=0.3659, and a fourth point at the coordinates of x=0.3345 and y=0.3314.

9. The light-emitting device according to claim 8, wherein the fluorescent material comprises a mixture of the first, second, and third fluorescent materials with a mass ratio of (6.5×C/A):(1.3×C/B):1 provided that peak emission intensities of the first, second, and third fluorescent materials are A:B:C, respectively, when measured by a spectrum corrected fluorescence spectrophotometer.

10. The light-emitting device according to claim 8, wherein the fluorescent material comprises a mixture of the first, second, and third fluorescent materials with a mass ratio of 10.3:2:1.

11. The light-emitting device according to claim 8, wherein the chromaticity is within a neutral white color range.

12. The light-emitting device according to any one of claims 1 to 3, wherein light obtained by mixing the light emitted by the semiconductor light-emitting element and the fluorescence emitted by the fluorescent material has chromaticity expressed by a rectangle formed on a CIE 1931 XYZ calorimetric system chromaticity diagram by connecting a first point at the coordinates of x=0.3938 and y=0.4097, a second point at the coordinates of x=0.3805 and y=0.3642, a third point at the coordinates of x=0.3656 and y=0.3905, and a fourth point at the coordinates of x=0.3584 and y=0.3499.

13. The light-emitting device according to claim 12, wherein the fluorescent material comprises a mixture of the first, second, and third fluorescent materials with a mass ratio of (6.3×C/A):(1.9×C/B):1 provided that peak emission intensities of the first, second, and third fluorescent materials are A:B:C, respectively, when measured by a spectrum corrected fluorescence spectrophotometer.

14. The light-emitting device according to claim 12, wherein the fluorescent material comprises a mixture of the first, second, and third fluorescent materials with a mass ratio of 10:3:1.

15. The light-emitting device according to claim 12, wherein the chromaticity is within a white color range.

16. The light-emitting device according to any one of claims 1 to 3, wherein light obtained by mixing the light emitted by the semiconductor light-emitting element and the fluorescence emitted by the fluorescent material has chromaticity expressed by a rectangle formed on a CIE 1931 XYZ calorimetric system chromaticity diagram by connecting a first point at the coordinates of x=0.4341 and y=0.4233, a second point at the coordinates of x=0.4171 and y=0.3846, a third point at the coordinates of x=0.4021 and y=0.4076, and a fourth point at the coordinates of x=0.3903 and y=0.3719.

17. The light-emitting device according to claim 16, wherein the fluorescent material comprises a mixture of the first, second, and third fluorescent materials with a mass ratio of (5.1×C/A):(1.9×C/B):1 provided that peak emission intensities of the first, second, and third fluorescent materials are A:B:C, respectively, when measured by a spectrum corrected fluorescence spectrophotometer.

18. The light-emitting device according to claim 16, wherein the fluorescent material comprises a mixture of the first, second, and third fluorescent materials with a mass ratio of 8:3:1.

19. The light-emitting device according to claim 16, wherein the chromaticity is within a warm white color range.

20. The light-emitting device according to any one of claims 1 to 3, wherein light obtained by mixing the light emitted by the semiconductor light-emitting element and the fluorescence emitted by the fluorescent material has chromaticity expressed by a rectangle formed on a CIE 1931 XYZ calorimetric system chromaticity diagram by connecting a first point at the coordinates of x=0.4775 and y=0.4283, a second point at the coordinates of x=0.4594 and y=0.3971, a third point at the coordinates of x=0.4348 and y=0.4185, and a fourth point at the coordinates of x=0.4214 and y=0.3887.

21. The light-emitting device according to claim 20 wherein, the fluorescent material comprises a mixture of the first, second, and third fluorescent materials with a mass ratio of (5.1×C/A):(1.6×C/B):1 provided that peak emission intensities of the first, second, and third fluorescent materials are A:B:C, respectively, when measured by a spectrum corrected fluorescence spectrophotometer.

22. The light-emitting device according to claim 20, wherein, the fluorescent material comprises a mixture of the first, second, and third fluorescent materials with a mass ratio of 8:2.5:1.

23. The light-emitting device according to claim 20, wherein the chromaticity is within an incandescent lamp color range.

24. An illumination apparatus comprising:
a light source including a light emitting device comprising:
  a semiconductor light-emitting element that emits blue-violet or blue light; and
  a fluorescent material that absorbs all or a part of the blue-violet or blue light emitted by the semiconductor light-emitting element and emits fluorescence of wavelengths different from that of the blue-violet or blue light,
wherein the fluorescent material comprises a mixture of a first fluorescent material that emits green or yellow-green light, a second fluorescent material that has a longer emission wavelength than that of the first fluorescent material and emits yellow-green, yellow, or yellow-red light, and a third fluorescent material that has a longer emission wavelength than the second fluorescent material and emits yellow-red or red light, and
the first fluorescent material is a europium-activated β-SiAlON fluorescent material, the second fluorescent material is a europium-activated α-SiAlON fluorescent material, and the third fluorescent material is a nitride crystalline red fluorescent material expressed by a formula of $(Ca,Eu)AlSiN_3$.

25. The illumination apparatus according to claim 24, wherein the α-SiAlON fluorescent material is expressed by a formula of $Ca_q Eu_r(Si,Al)_{12}(O,N)_{16}$ in which q is between about 0.75 and about 1.0 and r is between about 0.03 and about 0.07 and has a primary phase of an α-SiAlON crystalline structure.

26. An illumination apparatus according to claim 24, wherein the β-SiAlON fluorescent material is expressed by a formula $Eu_s(Si,Al)_{6-s}(O,N)_8$ in which s is between about 0.011 and about 0.019 and has a primary phase of a β-SiAlON crystalline structure.

* * * * *